United States Patent
Adusumilli et al.

(10) Patent No.: US 11,282,740 B2
(45) Date of Patent: Mar. 22, 2022

(54) BULK SEMICONDUCTOR STRUCTURE WITH A MULTI-LEVEL POLYCRYSTALLINE SEMICONDUCTOR REGION AND METHOD

(71) Applicant: GLOBALFOUNDRIES U.S. Inc., Malta, NY (US)

(72) Inventors: Siva P. Adusumilli, South Burlington, VT (US); Mark D. Levy, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/992,165

(22) Filed: Aug. 13, 2020

(65) Prior Publication Data

US 2022/0051929 A1    Feb. 17, 2022

(51) Int. Cl.
*H01L 21/00* (2006.01)
*H01L 21/763* (2006.01)
*H01L 29/06* (2006.01)
*H01L 29/04* (2006.01)

(52) U.S. Cl.
CPC ............ *H01L 21/763* (2013.01); *H01L 29/04* (2013.01); *H01L 29/0642* (2013.01)

(58) Field of Classification Search
None
See application file for complete search history.

(56) References Cited

U.S. PATENT DOCUMENTS

| | | | |
|---|---|---|---|
| 4,786,608 A | 11/1988 | Griffith | |
| 5,723,896 A | 3/1998 | Yee et al. | |
| 6,258,688 B1 | 7/2001 | Tsai | |
| 6,833,322 B2 | 12/2004 | Anderson et al. | |
| 8,299,537 B2 | 10/2012 | Greco et al. | |
| 10,192,779 B1 | 1/2019 | Shank et al. | |
| 10,319,716 B2 | 6/2019 | Moen et al. | |
| 10,580,893 B2 | 3/2020 | Adusumilli et al. | |
| 2019/0131438 A1 | 5/2019 | McPartlin | |

*Primary Examiner* — Reema Patel
(74) *Attorney, Agent, or Firm* — Gibb & Riley, LLC; Francois Pagette

(57) ABSTRACT

Disclosed is a bulk semiconductor structure that includes a semiconductor substrate with a multi-level polycrystalline semiconductor region that includes one or more first-level portions (i.e., buried portions) and one or more second-level portions (i.e., non-buried portions). Each first-level portion can be within the semiconductor substrate some distance below the top surface (i.e., buried), can be aligned below a monocrystalline semiconductor region and/or a trench isolation region, and can have a first maximum depth. Each second-level portion can be within the semiconductor substrate at the top surface, can be positioned laterally adjacent to a trench isolation region, and can have a second maximum depth that is less than the first maximum depth. Also disclosed herein are method embodiments for forming the bulk semiconductor structure wherein the first-level and second-level portions of the multi-level polycrystalline semiconductor region are concurrently formed (e.g., using a single module).

20 Claims, 13 Drawing Sheets

US 11,282,740 B2

1

BULK SEMICONDUCTOR STRUCTURE WITH A MULTI-LEVEL POLYCRYSTALLINE SEMICONDUCTOR REGION AND METHOD

BACKGROUND

Field of the Invention

The present invention relates to isolation of semiconductor devices on bulk semiconductor substrates and, more particularly, to embodiments of a bulk semiconductor structure with a multi-level polycrystalline semiconductor region and to embodiments of a method forming the structure.

Description of Related Art

Integrated circuit (IC) designs for bulk semiconductor substrates may include buried high-resistivity polycrystalline semiconductor regions, which are within the semiconductor substrate below certain types of semiconductor devices, such as radio frequency (RF) switches, to reduce harmonics and/or parasitic loss. They may also include non-buried high-resistivity polycrystalline semiconductor within the semiconductor substrate immediately adjacent to the top surface. Conventional techniques used to form the buried high-resistivity polycrystalline semiconductor regions are typically performed prior to semiconductor device formation or even prior to well region formation, whereas conventional techniques used to form the non-buried high-resistive polycrystalline semiconductor regions are typically performed later in the fabrication process (e.g., following semiconductor device formation and, particularly, following silicide formation on the semiconductor device(s)).

SUMMARY

In view of the foregoing, disclosed herein are embodiments of a bulk semiconductor structure that includes a semiconductor substrate with a multi-level polycrystalline semiconductor region that includes one or more first-level portions (i.e., buried portions) and one or more second-level portions (i.e., non-buried portions). Each first-level portion can be within the semiconductor substrate some distance below the top surface (i.e., buried), can be aligned below a monocrystalline semiconductor region and/or a trench isolation region, and can have a first maximum depth. Each second-level portion can be within the semiconductor substrate at the top surface, can be positioned laterally adjacent to a trench isolation region, and can have a second maximum depth that is less than the first maximum depth. Also disclosed herein are method embodiments for forming the bulk semiconductor structure wherein the first-level and second-level portions of the multi-level polycrystalline semiconductor region are concurrently formed (e.g., using a single module).

More particularly, disclosed herein are embodiments of a bulk semiconductor structure. The bulk semiconductor structure can include a bulk semiconductor substrate. The bulk semiconductor substrate can have a bottom surface and a top surface opposite the bottom surface. The bulk semiconductor structure can further include trench isolation regions in the semiconductor substrate at the top surface. Furthermore, the bulk semiconductor substrate can include a monocrystalline semiconductor region and a multi-level polycrystalline semiconductor region. The monocrystalline semiconductor region can be within the semiconductor

2 substrate at the top surface and positioned laterally adjacent to a first side of a first trench isolation region. The multi-level polycrystalline semiconductor region can include one or more first-level portions (i.e., one or more buried portions). Each first-level portion can be within the semiconductor substrate, can be physically separated from the top surface of the semiconductor substrate, and can have a first maximum depth. One of the first-level portions can specifically be below the monocrystalline semiconductor region. The multi-level polycrystalline semiconductor region can further include one or more second-level portions (i.e., one or more non-buried portion). Each second-level portion can be within the semiconductor substrate immediately adjacent to the top surface and can have a second maximum depth that is less than the first maximum depth. One of the second-level portions can specifically be positioned laterally adjacent to a second side of the first trench isolation region opposite the first side.

Also disclosed herein are method embodiments for forming a bulk semiconductor structure. Generally, the method embodiments can include providing a bulk semiconductor substrate. Trench isolation regions can be formed in the semiconductor substrate at the top surface. Following trench isolation region formation, a multi-level polycrystalline semiconductor region can be formed within the semiconductor substrate. The multi-level polycrystalline semiconductor region can be formed in a manner that currently forms one or more first-level portions (i.e., one or more buried portions) and one or more second-level portions (i.e., one or more non-buried portions). The first-level portion(s) can be formed so as to be physically separated from the top surface of the semiconductor substrate and so as to have a first maximum depth. One first-level portion can specifically be formed below a monocrystalline semiconductor region, which is at the top surface of the semiconductor substrate and positioned laterally adjacent to a first side of a first trench isolation region. The second-level portion(s) can be formed at the top surface of the semiconductor substrate and so as to have a second maximum depth that is less than the first maximum depth. One second-level portion can specifically be formed so that it is positioned laterally adjacent to a second side of the first trench isolation region opposite the first side.

More specifically, a method embodiment for forming a bulk semiconductor structure can include providing a bulk semiconductor substrate. A protective layer can be formed on the semiconductor substrate. Trench isolation regions can be formed so that they extend through the protective layer and into the semiconductor substrate. A multi-level polycrystalline semiconductor region can subsequently be formed in the semiconductor substrate. To form the multi-level polycrystalline semiconductor region, an opening can be formed in the protective layer on a first side of a first trench isolation region, leaving a remaining portion of the protective layer at least above the semiconductor substrate on a second side of the first trench isolation region opposite the first side. Then, a doped region can be formed within the semiconductor substrate such that the doped region has a modified crystalline structure. During formation of this doped region, the remaining portion of the protective layer locally limits a depth of the doped region. Following the dopant implantation process, the doped region can be recrystallized. Recrystallization of the doped region creates a monocrystalline semiconductor region at the top surface of the semiconductor substrate positioned laterally adjacent to the first side of the first trench isolation region. Recrystallization of the doped region also creates the multi-level polycrystalline semiconductor region including a first-level portion, which is below the monocrystalline semiconductor region and which has a first maximum depth, and a second-level portion, which is at the top surface of the semiconductor substrate positioned laterally adjacent to the second side of the first trench isolation region and which has a second maximum depth that is less than the first maximum depth.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, integrated circuit (IC) designs for bulk semiconductor substrates may include buried high-resistivity polycrystalline semiconductor regions, which are within the semiconductor substrate below certain types of semiconductor devices, such as radio frequency (RF) switches, to reduce harmonics and/or parasitic loss. Conventional techniques used to form a buried high-resistivity polycrystalline semiconductor region include: implanting ions of an inert dopant into the semiconductor substrate to create a dopant implant region with a modified crystalline structure (e.g., an amorphous crystalline structure); and performing a rapid thermal anneal (RTA) process to recrystallize the dopant implant region and, particularly, to form a monocrystalline semiconductor region at the top surface of the semiconductor substrate and a polycrystalline semiconductor region buried below the monocrystalline semiconductor region but above a remaining monocrystalline lower portion of the semiconductor substrate. Such buried high-resistivity polycrystalline semiconductor regions are typically formed prior to semiconductor device formation or even prior to well region formation. IC designs for bulk semiconductor substrates may also include non-buried high-resistivity polycrystalline semiconductor within the semiconductor substrate immediately adjacent to the top surface. These non-buried high-resistive polycrystalline semiconductor regions are typically formed later in the fabrication process (e.g., following semiconductor device formation and, particularly, following silicide formation on the semiconductor device(s)).

In view of the foregoing, disclosed herein are embodiments of a bulk semiconductor structure that includes a semiconductor substrate with a multi-level polycrystalline semiconductor region that includes one or more first-level portions (i.e., buried portions) and one or more second-level portions (i.e., non-buried portions). Each first-level portion can be within the semiconductor substrate some distance below the top surface (i.e., buried), can be aligned below a monocrystalline semiconductor region and/or a trench isolation region, and can have a first maximum depth. Each second-level portion can be within the semiconductor substrate at the top surface, can be positioned laterally adjacent to a trench isolation region, and can have a second maximum depth that is less than the first maximum depth. Also disclosed herein are method embodiments for forming the bulk semiconductor structure wherein the first-level and second-level portions of the multi-level polycrystalline semiconductor region are concurrently formed (e.g., using a single module).

Figure 1A:
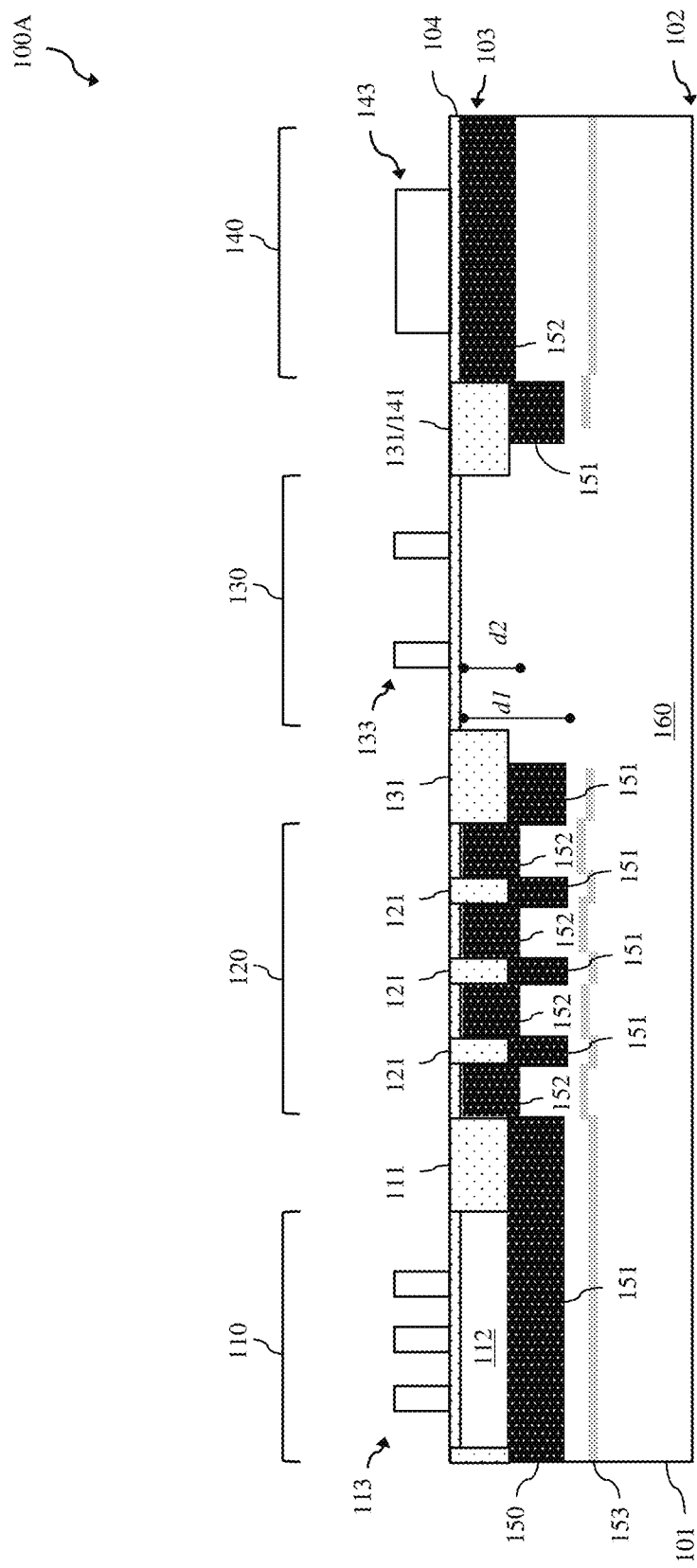
FIG. 1A is a cross-section diagram illustrating embodiments of a bulk semiconductor structure with a multi-level polycrystalline semiconductor region.
Figure 1B:
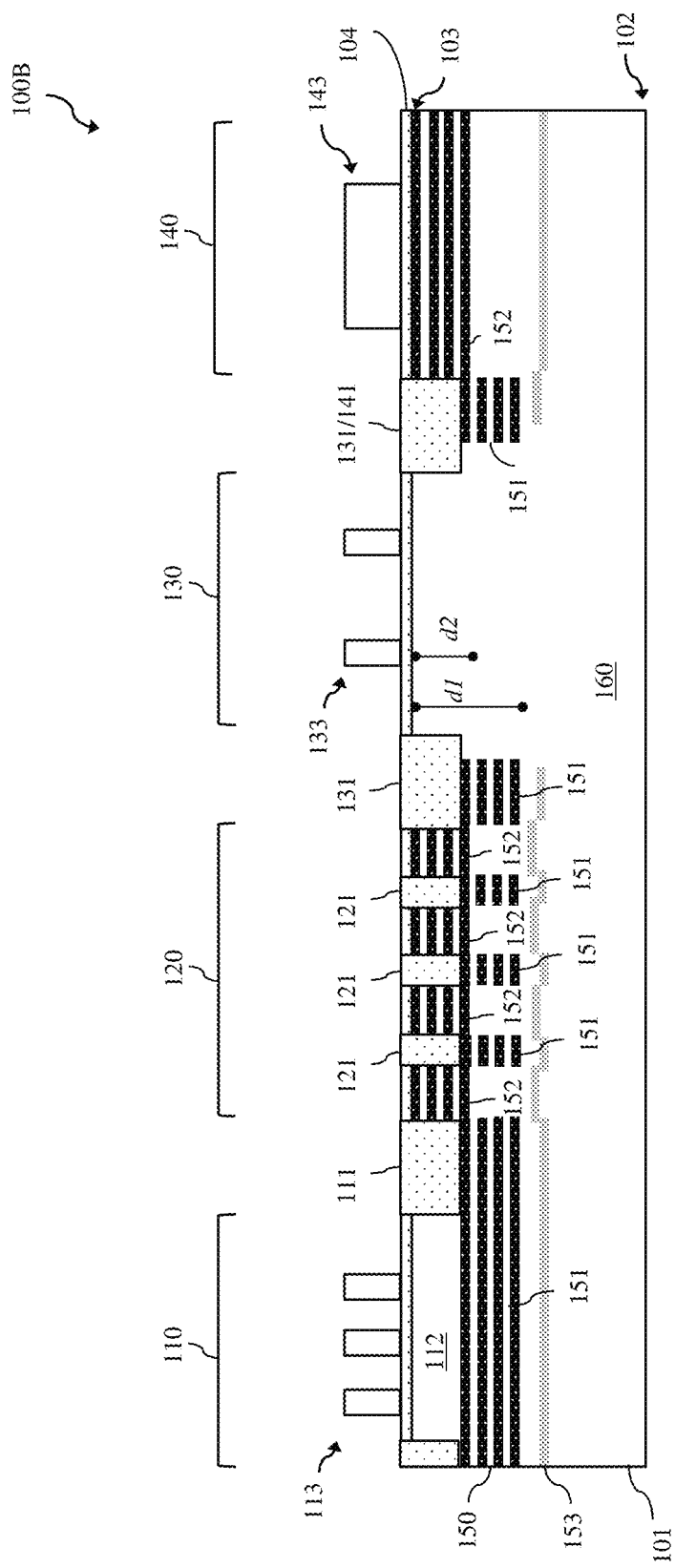
FIG. 1B is a cross-section diagram illustrating additional embodiments of a bulk semiconductor structure with a multi-level polycrystalline semiconductor region.

Referring to FIGS. 1A and 1B, disclosed herein are embodiments of a bulk semiconductor structure 100A and 100B, respectively. This structure 100A, 100B can include a bulk semiconductor substrate 101 (e.g., a bulk silicon substrate).

The structure 100A, 100B can include a first section 110 and, particularly, an active semiconductor device section and one or more additional sections including a second section 120 (e.g., a dummy fill shape section), a third section 130 (e.g., an additional active semiconductor device section) and/or a fourth section 140 (e.g., a passive device section). For purposes of illustration, the structure 100A, 100B is described below and illustrated in the drawings as having all four sections 110, 120, 130 and 140. However, it should be understood that the figures are not intended to be limiting. The structure 100A, 100B can include the first section 110 and the second section 120 only. Alternatively, the structure 100A, 100B can include the first section 110, the second section 120 and either the third section 130 or the fourth section 140. Alternatively, the structure 100A, 100B can include the first section 110 and the fourth section 140 only. Alternatively, the structure 100A, 100B can include the first section 110, the third section 130, and the fourth section 140. Alternatively (as illustrated), the structure 100A, 100B can include the first section 110, the second section 120, the third section 130 and the fourth section 140.

In any case, the structure 100A, 100B can further include trench isolation regions, such as shallow trench isolation (STI) regions. These STI regions can include trenches, which are lithographically patterned and etched into a top surface 103 of the semiconductor substrate 101 and which are filled with a first dielectric material. The first dielectric material can be, for example, silicon dioxide (SiO2). The bottom surfaces of the STI regions can be at essentially the same level (e.g., at some predetermined depth from the top surface 103 of the semiconductor substrate 101 and above the bottom surface 102 of the semiconductor substrate 101).

The STI regions can specifically include a first STI region 111, which defines the limits of the first section 110 (e.g., the active semiconductor device section). That is, the first STI region 111 can be positioned laterally adjacent to and, optionally, can laterally surround an upper portion of the semiconductor substrate 101 in the first section 110. The first STI region 111 can have a first width, which is sufficient to provide lateral electrical isolation of the first section from any adjacent sections.

The STI regions can further include one or more additional STI regions associated with the one or more additional sections, respectively.

For example, when the structure 100A, 100B includes the second section 120 (e.g., the dummy fill shape section), the STI regions can include multiple second STI regions 121 located throughout an upper portion of the semiconductor substrate 101 within the second section 120. The second STI regions 121 can be distributed (e.g., essentially uniformly) across the second section 120. The second STI regions 121 can be, for example, essentially square or circular in-shape (when viewed in a horizontal cross-section). Additionally, the second STI regions 121 can have a relatively small width. That is, the second STI regions 121 can each have a second width that is less than the first width of the STI region 111. For purposes of this disclosure, it should be understood that a dummy fill shape section refers to a section of a semiconductor structure that is devoid of active semiconductor devices. Instead, a dummy fill shape section includes semiconductor and isolation fill shapes and, more particularly, isolation fill shapes distributed (e.g., essentially uniformly) across a semiconductor region such that the portions of the semiconductor region that laterally surround and extend laterally between the isolation fill shapes make up the semiconductor fill shapes. The specific arrangement of the semiconductor and isolation fill shapes can be designed for chemical mechanical planarization (CMP) process optimization.

When the structure 100A, 100B includes the third section 130 (e.g., the additional active semiconductor device section), the STI regions can include a third STI region 131, which defines the limits of the third section 130. That is, the third STI region 131 can be positioned laterally adjacent to and, optionally, can laterally surround an upper portion of the semiconductor substrate 101 in the third section 130. The third STI region 131 can, for example, have essentially the same first width as the first STI region 111. Alternatively, the third STI region 131 can have any other width which is sufficient to provide the required lateral electrical isolation.

When the structure 100A, 100B includes the fourth section 140 (e.g., the passive device section), the STI regions can include a fourth STI region 141, which defines the limits of this fourth section 140. That is, the fourth STI region 141 can be positioned laterally adjacent to and, optionally, can laterally surround an upper portion of the semiconductor substrate 101 in the fourth section 140. The fourth STI region 141 can, for example, have essentially the same first width as the first STI region 111. Alternatively, the fourth STI region 141 can have any other width which is sufficient to provide the required lateral electrical isolation. Optionally, the STI regions can be patterned such that STI regions between adjacent sections are shared (e.g., see shared STI regions 131/141 between sections 130 and 140).

The semiconductor substrate 101 can further include an isolated monocrystalline semiconductor region 112 (e.g., a monocrystalline silicon region). This monocrystalline semiconductor region 112 can be in the first section 110 and, particularly, in the semiconductor substrate 101 immediately adjacent to the top surface 103 and positioned laterally adjacent to a first side (e.g., an inner side) of the first STI region 111.

The semiconductor substrate 101 can further include a high-resistivity multi-level polycrystalline semiconductor region 150 (e.g., a high-resistivity multi-level polysilicon region). The multi-level polycrystalline semiconductor region 150 can include one or more first-level portions (i.e., one or more buried portions) 151 and one or more second-level portions (i.e., one or more non-buried portions).

Each first-level portion 151 can be within the semiconductor substrate 101, can be physically separated from the top surface 103 of the semiconductor substrate 101, and can have a first maximum depth (d1). The first maximum depth (d1) refers to the distance of the bottom (i.e., lowermost point) of a first-level portion 151 as measured from the top surface 103 of the semiconductor substrate 101. It should be noted that the first maximum depths (d1) of different first-level portions 151 are approximately the same, as illustrated; however, some across-substrate process variations may occur. For example, there may be slight differences in the maximum depth of first-level portions below the STI regions as compared to the monocrystalline semiconductor region. One of the first-level portions 151 can specifically be in the first section 110 aligned below the monocrystalline semiconductor region 112. As illustrated, this first-level portion can also extend laterally below the first trench isolation region 111. When the structure 100A, 100B includes the second section 120, first-level portions 151 can further be aligned below each of the second STI regions 121. When the structure 100A, 100B includes the third section 130, a first-level portion 151 can further be aligned below the third STI region 131. When the structure 100A, 100B includes the fourth section 140, a first-level portion 151 can be aligned below the fourth STI region 141.

Each second-level portion 152 can be immediately adjacent to the top surface 103 of the semiconductor substrate 101 and can have a second maximum depth (d2) that is less than the first maximum depth (d1). The second maximum depth (d2) refers to the distance of the bottom (i.e., lowermost point) of a second-level portion 152 as measured from the top surface 103 of the semiconductor substrate 101. It should be noted that the second maximum depths (d2) of different second-level portions are approximately the same; however, some across-substrate process variations may occur. In any case, the second maximum depths (d2) of all of the second-level portions 152 are less than the first maximum depths (d1) of all of the first-level portions 151. One of the second-level portions 152 can specifically be positioned laterally adjacent to a second side (e.g., an outer side) of the first STI region 111 opposite the first side such that the first STI region 111 is positioned laterally between the monocrystalline semiconductor region 112 and the second-level portion 152 of the multi-level polycrystalline semiconductor region 150. When the structure 100A, 100B includes the second section 120 (e.g., the dummy fill shape section), second-level portions 152 can also be within the second section 120 laterally surrounding and extending laterally between each of the second STI regions 121. That is, second-level portions 152 can make up semiconductor fill shapes within the second section 120. Furthermore, when the structure 100A, 100B includes the fourth section, a second-level portion 152 can be within the fourth section 140 and positioned laterally adjacent to the fourth STI region 141.

It should be noted that, due to the method used to form the multi-level polycrystalline semiconductor region 150 (discussed in greater detail below with regard to the method embodiments), the multi-level polycrystalline semiconductor region 150 and at least the adjacent lower portion of the monocrystalline semiconductor region 112 will be doped with (i.e., contain) an inert dopant. For purposes of this disclosure, an inert dopant refers to a dopant species that is generally not considered to be chemically reactive (i.e., that is neutral) at least with respect to the monocrystalline semiconductor material (e.g., monocrystalline silicon) within which it is implanted during processing, that is capable of modifying the crystalline structure of that monocrystalline semiconductor material during the implantation process (e.g., to create an amorphous region), that doesn't prevent recrystallization of the doped region during a subsequent rapid thermal anneal process (RTA) (e.g., to create poly and/or monocrystalline region(s)), and that doesn't significantly impact the electrical properties of the resulting poly and/or monocrystalline region(s). Such inert dopants include, but are not limited to, inert gases (also referred to as noble gases) (e.g., argon, xenon, helium, neon, krypton, radon, etc.), silicon, or any other suitable inert dopant. Additionally, depending upon the particular technique used to form the multi-level polycrystalline semiconductor region 150 (as discussed in greater detail below with regard to the method), the multi-level polycrystalline semiconductor region 150 may include a single relatively thick layer of polycrystalline semiconductor material. For example, as shown in the structure 100A of FIG. 1A, each of the first-level portions 151 and each of the second-level portions 152 is fully polycrystalline. Alternatively, the multi-level polycrystalline semiconductor region 150 may be multi-layered. For example, as shown in the structure 100B of FIG. 1B, each of the first-level portions 151 and each of the second-level portions 152 may include multiple defined layers of the polycrystalline semiconductor material separated by thin layers of crystalline semiconductor material.

It should be noted that the semiconductor substrate 101 also may or may not include a processing artifact and, particularly, a relatively thin region 153 of high-resistivity polycrystalline semiconductor material (e.g., a relatively thin region of high-resistivity polysilicon) aligned below the multi-level polycrystalline semiconductor region 150. This relatively thin region 153 may vary in shape. For example, it could have multi-level portions (similar to the profile shown or with some other profile) or, alternatively, it could be essentially planar.

The semiconductor substrate 101 can further include an additional monocrystalline semiconductor region 160. In the first section 110 and, if present, in the second section 120 and/or in the fourth section 140, the additional monocrystalline semiconductor region 160 can encompass the lower portion of the semiconductor substrate, extending from the bottom of the multi-level polycrystalline semiconductor region 150 (and, particularly, from the bottoms of the different levels 151-152 of the multi-level polycrystalline semiconductor region 150) to the bottom surface 102 of the semiconductor substrate 101. In the third section 130 (if present), this additional monocrystalline semiconductor region 160 can extend from the top surface 103 of the semiconductor substrate 101 to the bottom surface 102 of the semiconductor substrate 101.

The first section 110 can further include one or more active semiconductor devices 113. Specifically, the monocrystalline semiconductor region 112 in the first section 110 can include the active device region for at least one semiconductor device 113. The semiconductor device(s) 113 can be, for example, radio frequency (RF) device(s), such as RF switch(es). In this case, the first-level portion 151 that is specifically aligned below the monocrystalline semiconductor region 112 and the first STI region 111 provides isolation between the RF switch(es) and the additional monocrystalline semiconductor region 160 of the semiconductor substrate 101 below and, thereby reduces harmonics. Additionally, or alternatively, the semiconductor device(s) 113 could be any other type of RF device and/or any other type of semiconductor device (e.g., bipolar junction transistor(s), etc.) that would similarly benefit from such buried isolation.

The third section 130 (if present) can further include one or more additional active semiconductor devices 133. Specifically, the monocrystalline semiconductor material at the top surface 103 of the semiconductor substrate 101 in the additional monocrystalline semiconductor region 160 can include the active device region for at least one additional semiconductor device 133. The additional semiconductor device(s) 133 can be complementary metal oxide semiconductor (CMOS) device(s), bipolar junction transistor(s), etc., that by design may not require or significantly benefit from such buried isolation.

Semiconductor devices, such as the semiconductor devices 113 and 133 described above, are well known in the art and various different well know configurations for these devices could be employed in the semiconductor structure 100A, 100B. Thus, the details of the semiconductor devices and configurations thereof have been omitted from the specification in order to allow the reader to focus on the salient aspects of the disclosed semiconductor structure.

It should be noted that the second section 120 (e.g., the dummy fill shape section) and the fourth section 140 (e.g., the passive device section) can be devoid of active semiconductor devices. As mentioned above, a dummy fill shape section refers to a section of a semiconductor structure that is devoid of active semiconductor devices. Instead, a dummy fill shape section includes semiconductor and isolation fill shapes and, more particularly, isolation fill shapes distributed (e.g., essentially uniformly) across a semiconductor region such that the portions of the semiconductor region that laterally surround and extend laterally between the isolation fill shapes make up the semiconductor fill shapes. The specific arrangement of the semiconductor and isolation fill shapes can be designed for chemical mechanical planarization (CMP) process optimization. A passive device section can include at least one passive device 143 (e.g., a resistor, a capacitor, an inductor, etc.) above the top surface 103 of the semiconductor substrate 101 (e.g., at the gate polysilicon layer, as shown, or, alternatively, in the back-end-of-the-line (BEOL) metal levels (not shown)). Such a passive device 143 may benefit from the additional isolation provided by the second-level portion 152 of the high-resistivity polycrystalline semiconductor region 150 within the fourth section 140 and, particularly, may exhibit reduced parasitic loss as a result of this region 150.

Also disclosed herein are method embodiments for forming a bulk semiconductor structure 100A, 100B, as described above and shown in FIGS. 1A and 1B. Generally, the method embodiments can include providing a bulk semiconductor substrate. Trench isolation regions, such as shallow trench isolation (STI) regions, can be formed in the semiconductor substrate at the top surface. Following trench isolation region formation, a multi-level polycrystalline semiconductor region can be formed within the semiconductor substrate. The multi-level polycrystalline semiconductor region can be formed in a manner that currently forms one or more first-level portions (i.e., one or more buried portions) and one or more second-level portions (i.e., one or more non-buried portions). The first-level portion(s) can be formed so as to be physically separated from the top surface of the semiconductor substrate and so as to have a first maximum depth. One first-level portion can specifically be formed below a monocrystalline semiconductor region, which is at the top surface of the semiconductor substrate and positioned laterally adjacent to a first side of a first trench isolation region. The second-level portion(s) can be formed at the top surface of the semiconductor substrate and so as to have a second maximum depth that is less than the first maximum depth. One second-level portion can specifically be formed so that it is positioned laterally adjacent to a second side of the first trench isolation region opposite the first side (e.g., so that the first trench isolation region is positioned laterally between the monocrystalline semiconductor region and a second-level portion of the multi-level polycrystalline semiconductor region).

Figure 2:
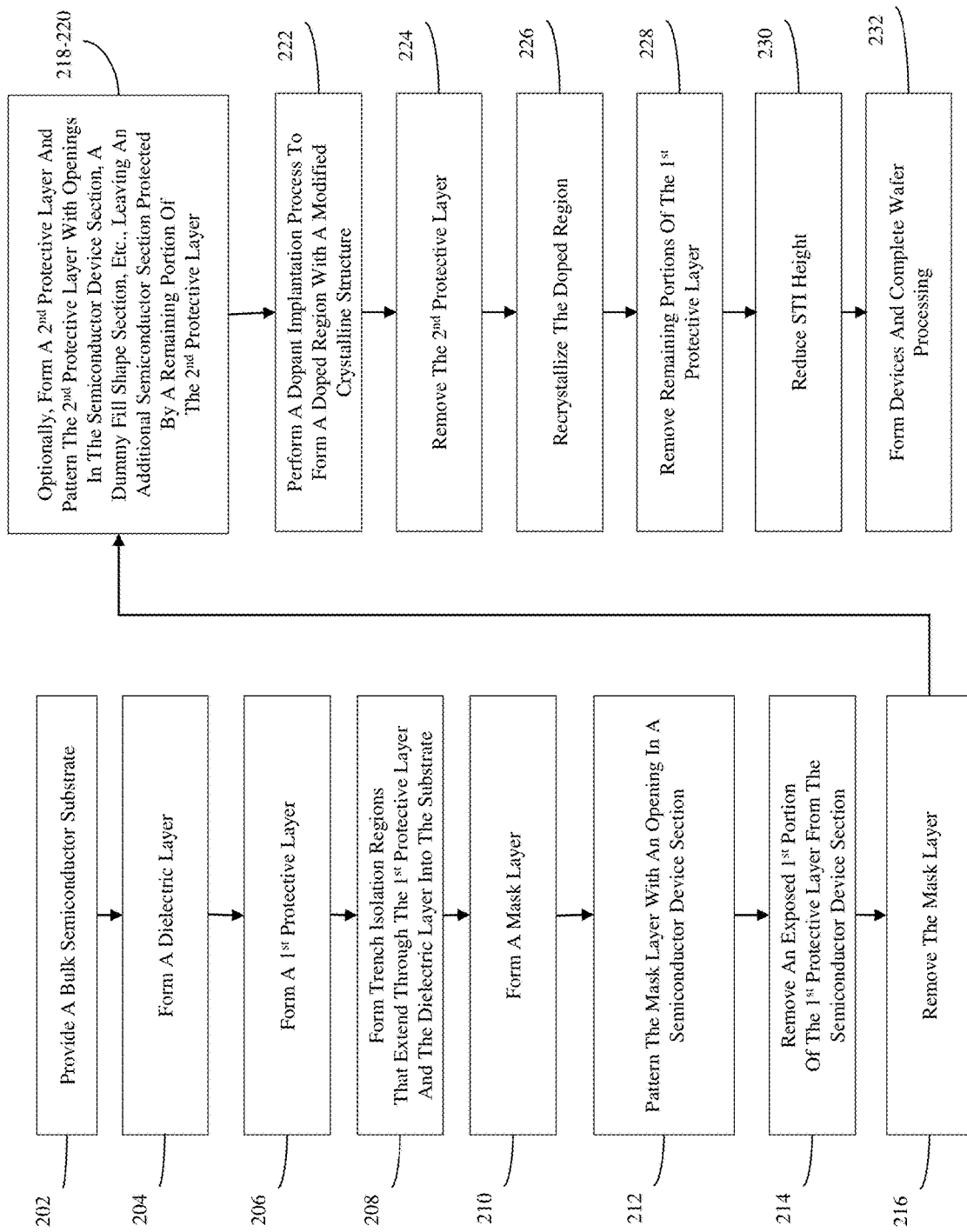
FIG. 2 is a flow diagram illustrating method embodiments for forming a bulk semiconductor structure with a multi-level polycrystalline semiconductor region.
Figure 3:
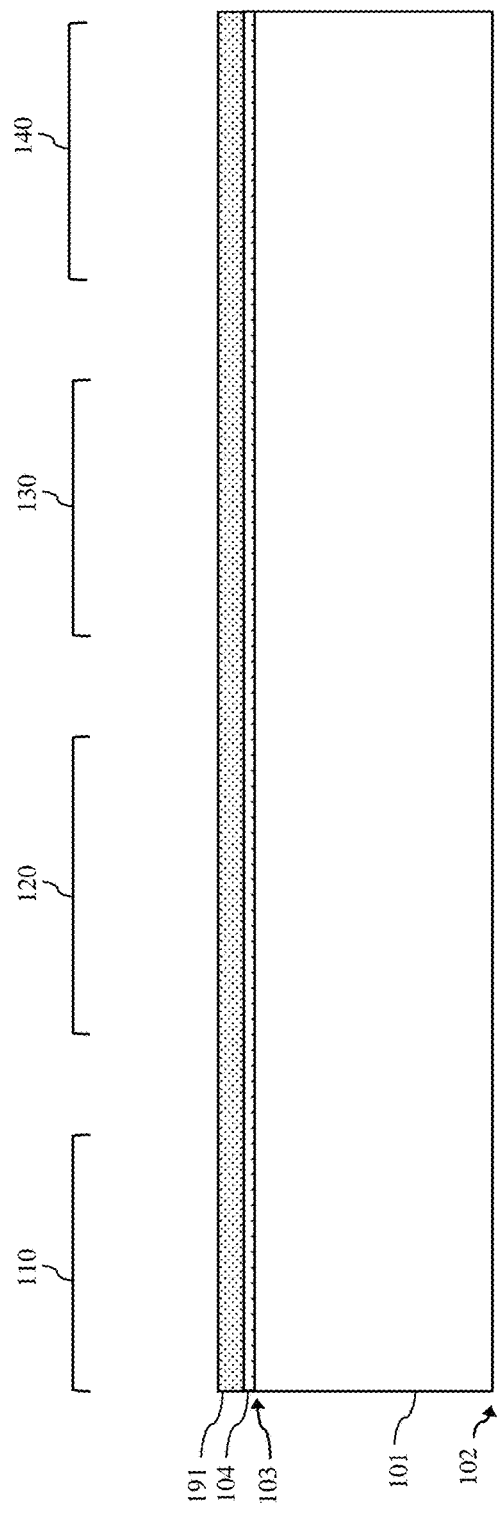
FIGS. 3-13 are partially completed structures formed according to the flow diagram of FIG. 2.

More specifically, referring to the flow diagram of FIG. 2, a method embodiment for forming a bulk semiconductor structure, such as the bulk semiconductor structure 100A shown in FIG. 1A or 100B shown in FIG. 1B and described in detail above, can include providing a bulk semiconductor substrate (e.g., a bulk monocrystalline silicon substrate) (see process step 202 and FIG. 3).

A thin dielectric layer 104 of a first dielectric material can be formed on the top surface 103 of the substrate 101 (see process step 204 and FIG. 3). The first dielectric material can be, for example, a silicon dioxide ($SiO_2$) layer deposited onto the top surface of the substrate 101 (e.g., by thermal oxidation).

A first protective layer 191 (also referred to herein as a dopant implant limiting layer) of a second dielectric material can be formed on the thin dielectric layer 104 (see process step 206 and FIG. 3). The second dielectric material can be different from the first dielectric material. For example, the second dielectric material can be silicon nitride (SiN) deposited onto the top surface of the dielectric layer 104 by, for example, chemical vapor deposition (CVD) or plasma-enhanced CVD (PECVD). The first protective layer 191 can be deposited so as to have a thickness sufficient to limit implantation of a dopant to a predetermined depth during a dopant implantation process at process step 222 (discussed in greater detail below). For example, the first protective layer 191 can have a thickness ranging from 30-250 nm.

Figure 4:
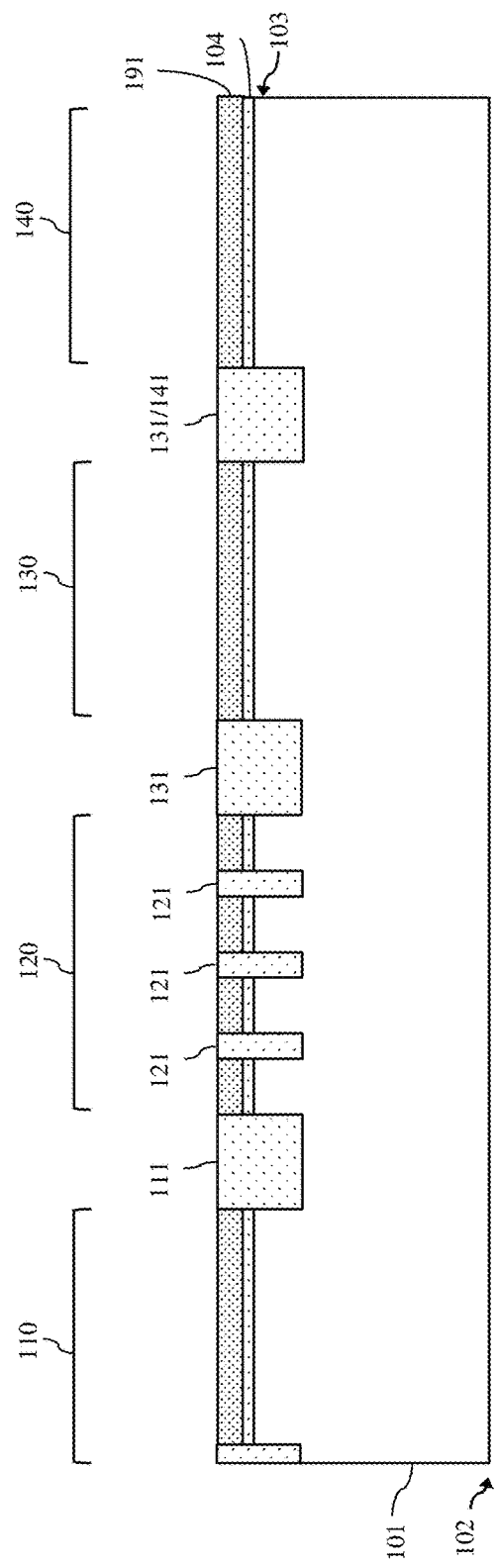

Trench isolation regions, such as shallow trench isolation (STI) regions, can then be formed so that they extend through the first protective layer 191 and the dielectric layer 104 and into the semiconductor substrate 101 (see process step 208 and FIG. 4).

It should be noted that the disclosed method embodiments can include integrated process steps for the formation of multiple different design sections in the same semiconductor structure. The sections can include a first section 110 (e.g., an active semiconductor device section) and one or more additional sections including a second section 120 (e.g., a dummy fill shape section), a third section 130 (e.g., an additional active semiconductor device section) and/or a fourth section 140 (e.g., a passive device section). For purposes of illustration, the method is described below and illustrated in the drawings with respect to the formation of all four of the sections on the same semiconductor substrate. However, it should be understood that the description and the figures are not intended to be limiting. The method could include forming a semiconductor structure having the first section 110 (e.g., a semiconductor device section) and the second section 120 (e.g., a dummy fill shape section) only. Alternatively, the method could forming a semiconductor structure having the first section 110, the second section 120 and either a third section 130 (e.g., an additional active semiconductor device section) or a fourth section 140 (e.g., a passive device section). Alternatively, the method could include forming a semiconductor structure having the first section 110 and the fourth section 140. Alternatively, the method could include forming a semiconductor structure having the first section 110, the third section 130, and the fourth section 140. Alternatively, the method could include forming a semiconductor structure having the first section 110, the second section 120, the third section 130 and the fourth section 140.

Thus, at process step 208, a first STI region 111 can be formed such that it defines the limits of the first section 110 (e.g., the active semiconductor device section). That is, the first STI region 111 can be formed (e.g., patterned, etched and filled) so that it is positioned laterally adjacent to and, optionally, so that it laterally surrounds an upper portion of the semiconductor substrate 101 in the first section 110. Furthermore, this first STI region 111 can be formed so that it has a first width, which is sufficient to provide lateral electrical isolation of the first section from any adjacent sections.

Additionally, at process step 208, one or more additional STI regions associated with the one or more additional sections, respectively, can be formed.

For example, when the structure 100A, 100B is to include the second section 120 (e.g., the dummy fill shape section), multiple second STI regions 121 can be formed (e.g., patterned, etched, and filled) so that they are located throughout an upper portion of the semiconductor substrate 101 within the second section 120. The second STI regions 121 can be formed so that they are distributed (e.g., essentially uniformly) within the second section 120. The second STI regions 121 can further be formed such that they are essentially square or circular in-shape (when viewed in a horizontal cross-section). Additionally, the second STI regions 121 can be formed so that they have a relatively small width. That is, the second STI regions 121 can each be formed so that they have a second width that is less than the first width of the STI region 111. As mentioned above, with regard to the structure embodiments, a dummy fill shape section refers to a section of a semiconductor structure that is devoid of active semiconductor devices. Instead, a dummy fill shape section includes semiconductor and isolation fill shapes and, more particularly, isolation fill shapes distributed (e.g., essentially uniformly) across semiconductor region such that the portions of the semiconductor region that laterally surround and extend laterally between the isolation fill shapes make up the semiconductor fill shapes. The specific arrangement of the semiconductor and isolation fill shapes can be designed for chemical mechanical planarization (CMP) process optimization.

When the structure 100A, 100B is to include the third section 130 (e.g., an additional active semiconductor device section), a third STI region 131 can be formed so as to define the limits of the third section 130. That is, the third STI region 131 can be formed so that it is positioned laterally adjacent to and, optionally, so that it laterally surrounds an upper portion of the semiconductor substrate 101 in the third section 130. The third STI region 131 can be formed so that it has be essentially the same first width as the first STI region 111. Alternatively, the third STI region 131 can be formed so that it has any other width which is sufficient to provide the required lateral electrical isolation.

When the structure 100A, 100B is to include the fourth section 140 (e.g., a passive device section), a fourth STI region 141 can be formed so as to define the limits of the fourth section 140. That is, the fourth STI region 141 can be formed so that it is positioned laterally adjacent to and, optionally, so that it laterally surrounds an upper portion of the semiconductor substrate 101 in the fourth section 140. The fourth STI region 141 can be formed so that it has essentially the same first width as the first STI region 111. Alternatively, the fourth STI region 141 can be formed so that it has any other width which is sufficient to provide the required lateral electrical isolation. It should be noted that, optionally, STI regions can be patterned such that STI regions between adjacent sections are shared (e.g., see shared STI regions 131/141 between sections 130 and 140).

The above-mentioned STI regions can be formed, at process step 208, using conventional STI formation techniques. Specifically, trenches can be lithographically patterned and etched such that they extend essentially vertically through the layers 191 and 104 and into the semiconductor substrate 101 with a bottom of each trench being some predetermined distance below the top surface 103 of the semiconductor substrate 101 and further being above the bottom surface 102 of the semiconductor substrate 101. Next, one or more layers of isolation material can be deposited so as to fill the trenches. In one exemplary embodiment, the isolation material can be the first dielectric material (e.g., $SiO_2$). Following deposition of the isolation material, a chemical mechanical polishing (CMP) process can be performed in order to remove any of the isolation fill material from the top surface of the first protective layer 191 such that the top surfaces of the STI regions and the top surface of the first protective layer 191 are essentially co-planar.

Figure 5:
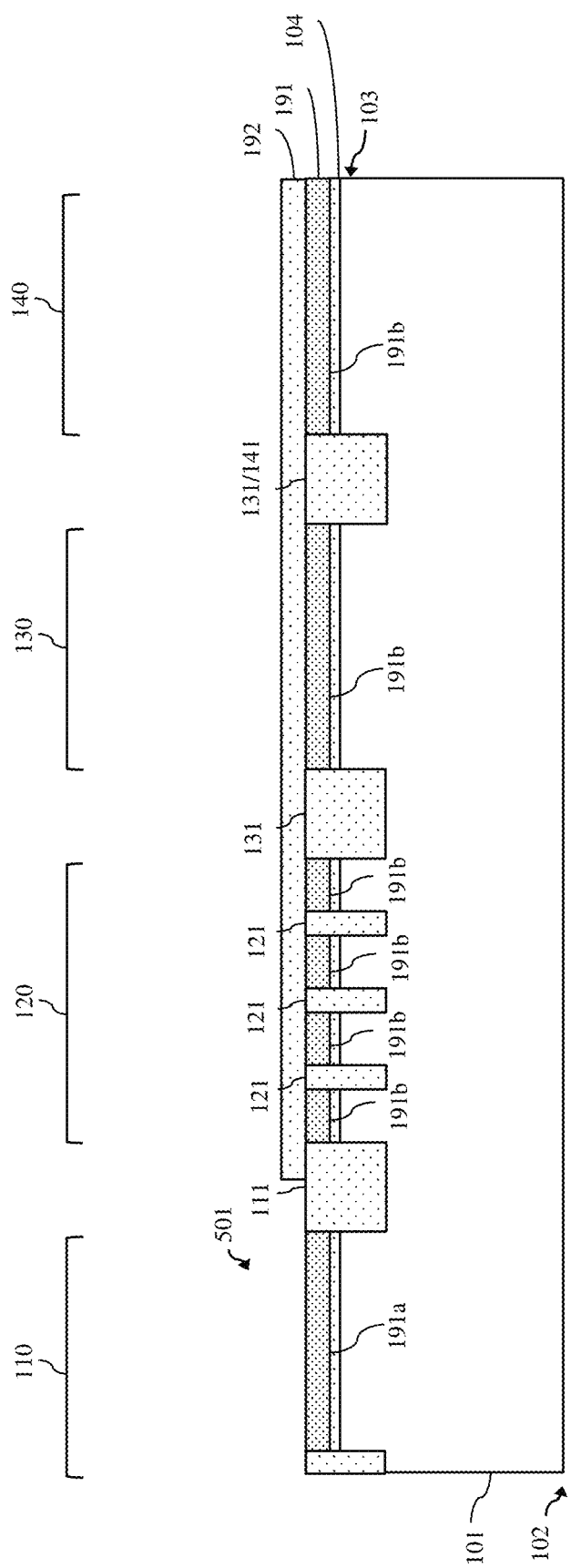

A mask layer 192 can be formed on the exposed surface of the first protective layer 191 and over the STI regions (see process step 210 and FIG. 5). The mask layer 192 can be made, for example, of the same first dielectric material (e.g., $SiO_2$) used for the dielectric layer 104 and can be deposited, for example, by PECVD. Alternatively, the mask layer 192 can be made of any suitable dielectric material that is different from the second dielectric material. The mask layer 192 can further be patterned so as to have an opening that exposes a first portion 191a of the first protective layer 191, which is in the first section 110 above the semiconductor substrate 101 and positioned laterally adjacent to a first side of the first STI region 11, leaving second portions 191b of the first protective layer 191 covered (see process step 212, and FIG. 5). Specifically, using conventional lithographic patterning and anisotropic etch techniques, an opening 501 can be formed in the mask layer 192 such that it extends essentially vertically through the mask layer 192 stopping on and exposing the first portion 191a of the first protective layer 191. Following formation of the opening at process step 212, second portions 191b of the first protective layer 191, which are adjacent to a second side of the first STI region 111 and which are further adjacent to any of the other STI regions can remain masked.

Figure 6:
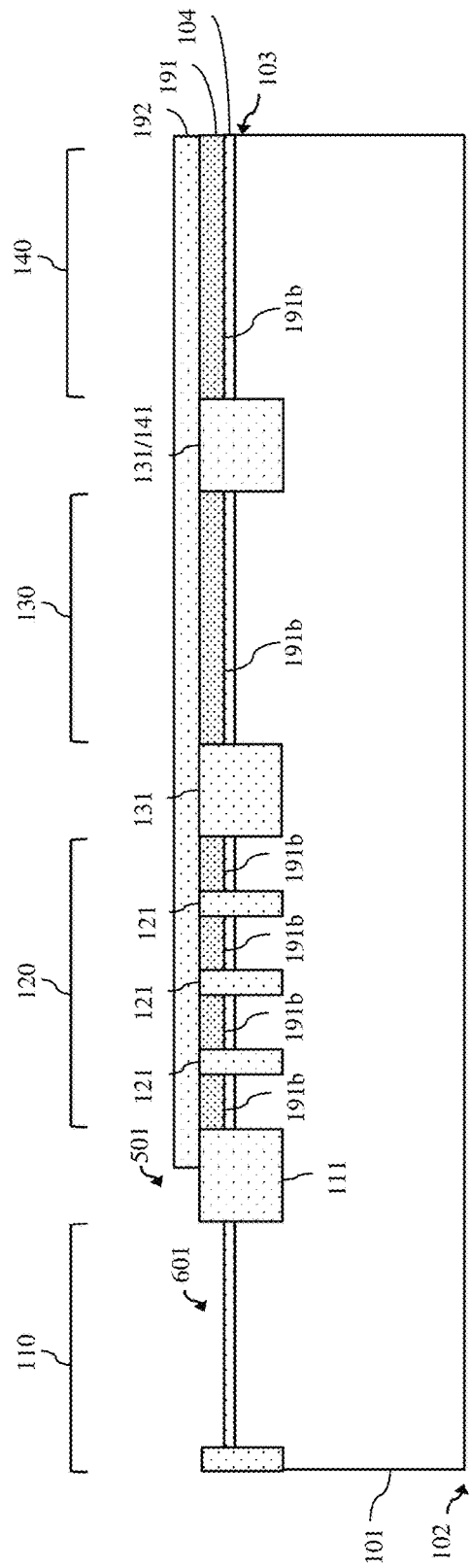

The exposed first portion 191a of the first protective layer 191 can be selectively removed from the first section 110 (i.e., from above the dielectric layer 104 on the first side of the first STI region 111), thereby creating an opening 601 in the first protective layer 191 (see process step 214 and FIG. 6). For example, if the dielectric layer 104, the STI regions, and the mask layer 192 are all made of the same first dielectric material (e.g., $SiO_2$) and if the first protective layer 191 is made of the second dielectric material (e.g., SiN), then any suitable process that selectively etches exposed SiN over exposed $SiO_2$ could be employed. For example, a hot phosphoric acid etch process could be used. The second portions 191b of the first protective layer 191 are protected from being etched at process step 214 by the remaining portion of the mask layer 192 and, thus, remain intact.

Figure 7:
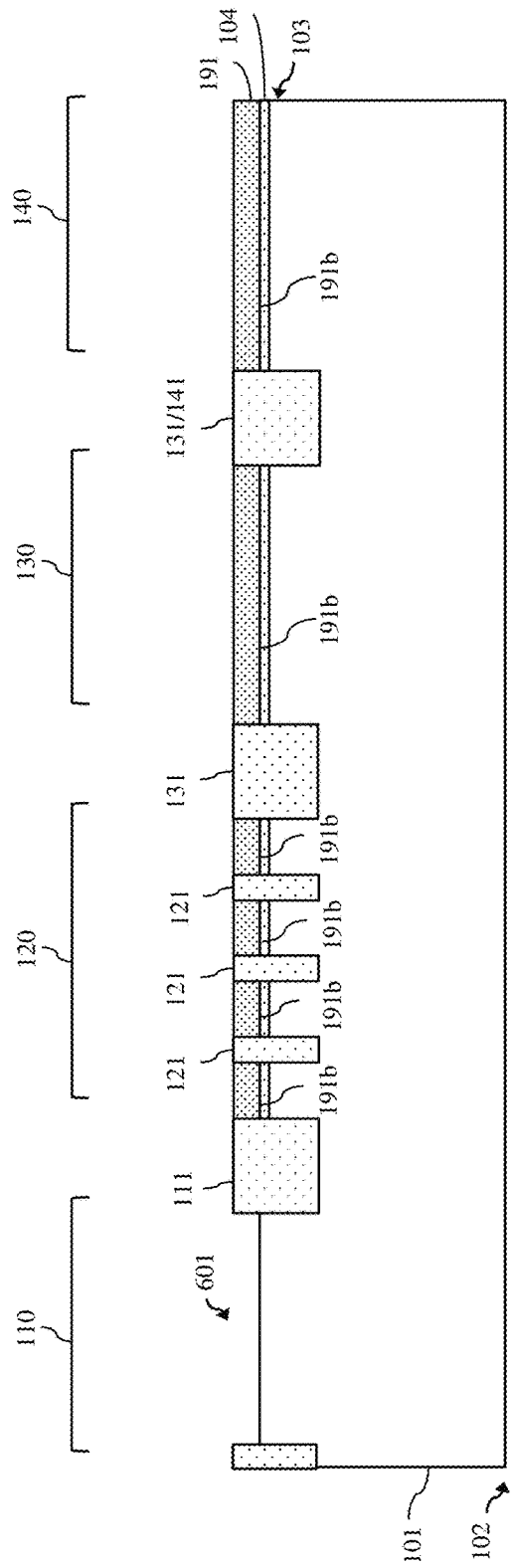
Figure 8:
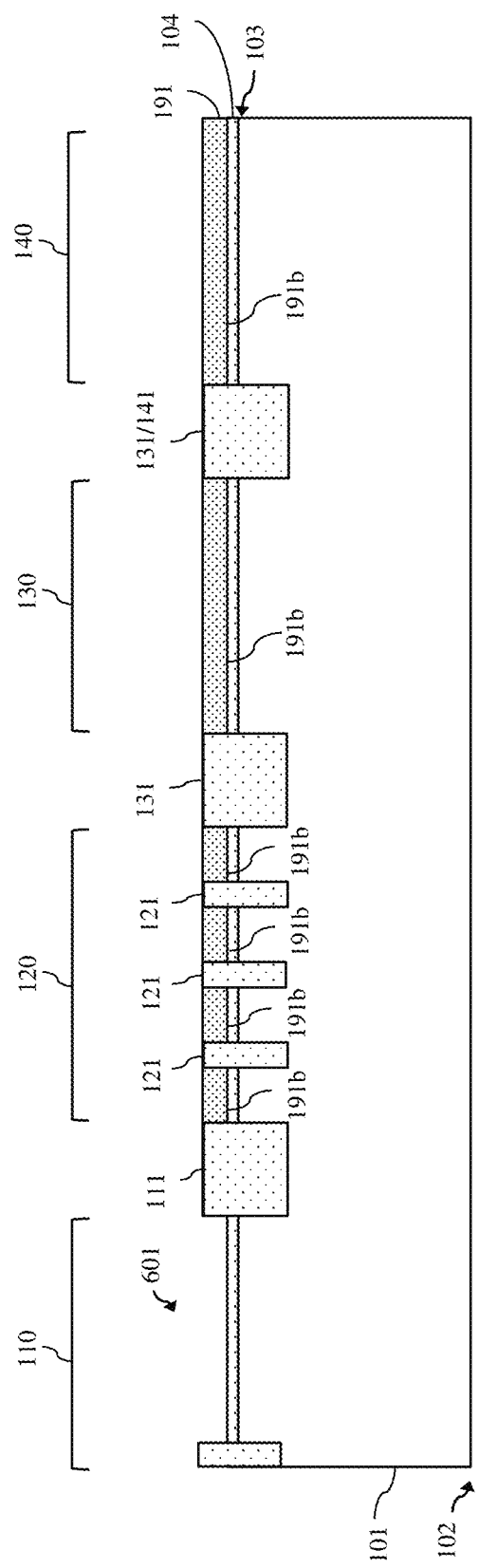

Optionally, the remaining portion of the mask layer 192 can be selectively removed (see process step 216 and FIG. 7). For example, if the mask layer 192 is made of the first dielectric material (e.g., $SiO_2$), it can be selective removed by a selective oxide wet etch process (e.g., a hydrofluoric acid (HF) etch) or by a reactive ion etch (RIE) process. It should be noted that, if the dielectric layer 104 and the mask layer 192 are made of the same first dielectric material (e.g., $SiO_2$), then process step 216 will also etch away the dielectric layer 104 from the first section 110, thereby exposing the top surface 103 of the semiconductor substrate 101, as shown in FIG. 7. Thus, before additional processing is performed, the first dielectric material of the dielectric layer 104 should be redeposited (e.g., regrown) on the exposed semiconductor surface within the first section 110 (see FIG. 8).

Figure 9:
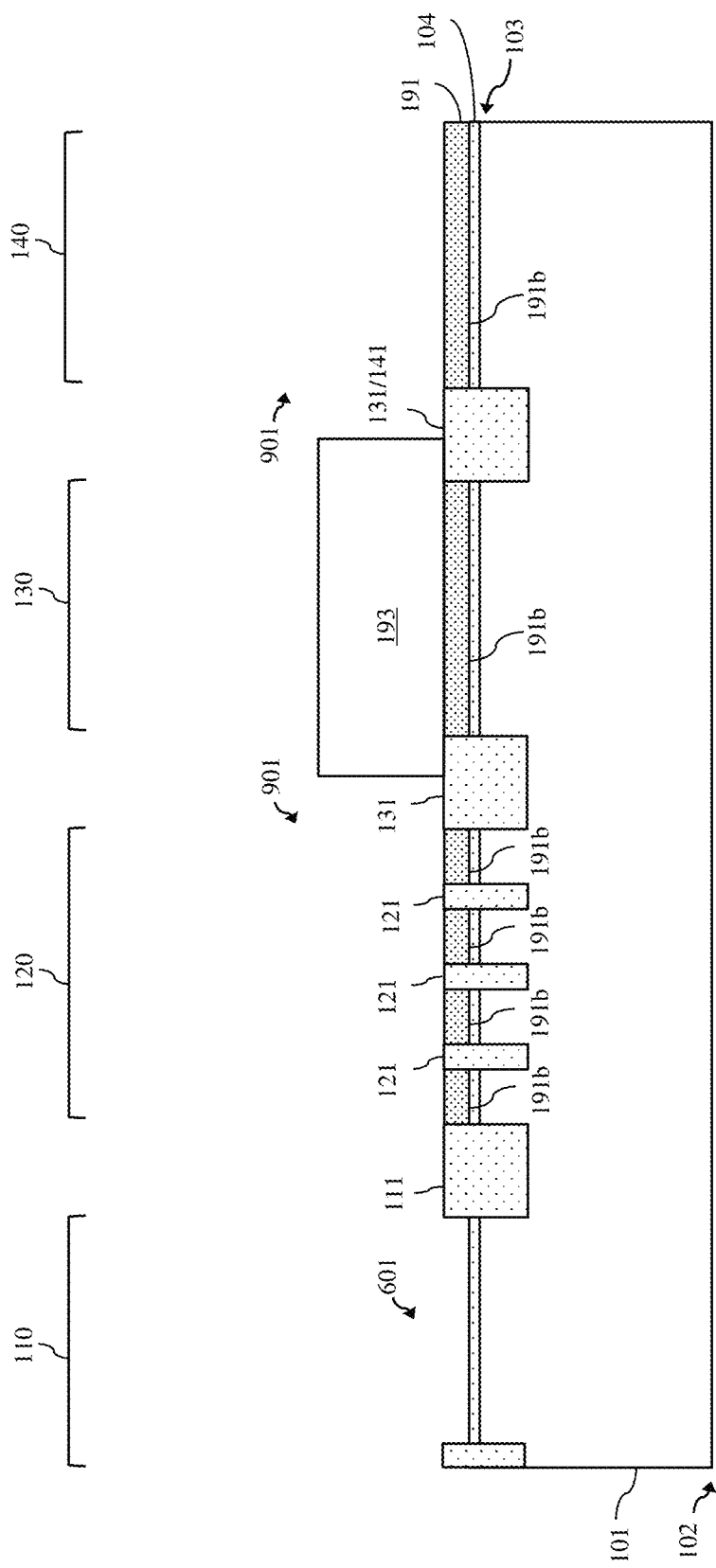

Optionally, a second protective layer 193 (also referred to herein as a dopant implant stopping layer) can be formed over the partially completed structure. This second protective layer 193 can be, for example, a photoresist mask layer, a nitride mask layer or a layer of any other suitable mask material. It should be noted that the second protective layer should be deposited so that it is thick enough (given whatever material it is made of) to prevent an inert dopant from passing into the semiconductor substrate 101 at process step 222, as discussed in greater detail below. For example, if the second protective layer 193 is a photoresist layer, it should be at least 2 nm and preferably 4 nm or greater in order to prevent substrate doping at process step 222. This second protective layer 193 can then be lithographically patterned and etched to form opening(s) 901 aligned above the first section 110 and the second section 120 and/or the fourth section 140, while leaving the third section 130 protected (see process steps 218-220 and FIG. 9). Process step 220 can specifically be performed so that the first dielectric material of the dielectric layer 104 in the first section 110 remains exposed and so that the second portions 191b of the first protective layer 191 in the second section 120 and/or in the fourth section 140 also remain exposed (i.e., not covered or protected by the second protective layer 193). It should be noted that the second protective layer 193 can be relatively thick (e.g., thicker than the first protective layer 191) and specifically thick enough to prevent (i.e., completely block) a dopant from being implanted into the semiconductor substrate 101 during the dopant implantation process at process step 222 below.

Figure 10:
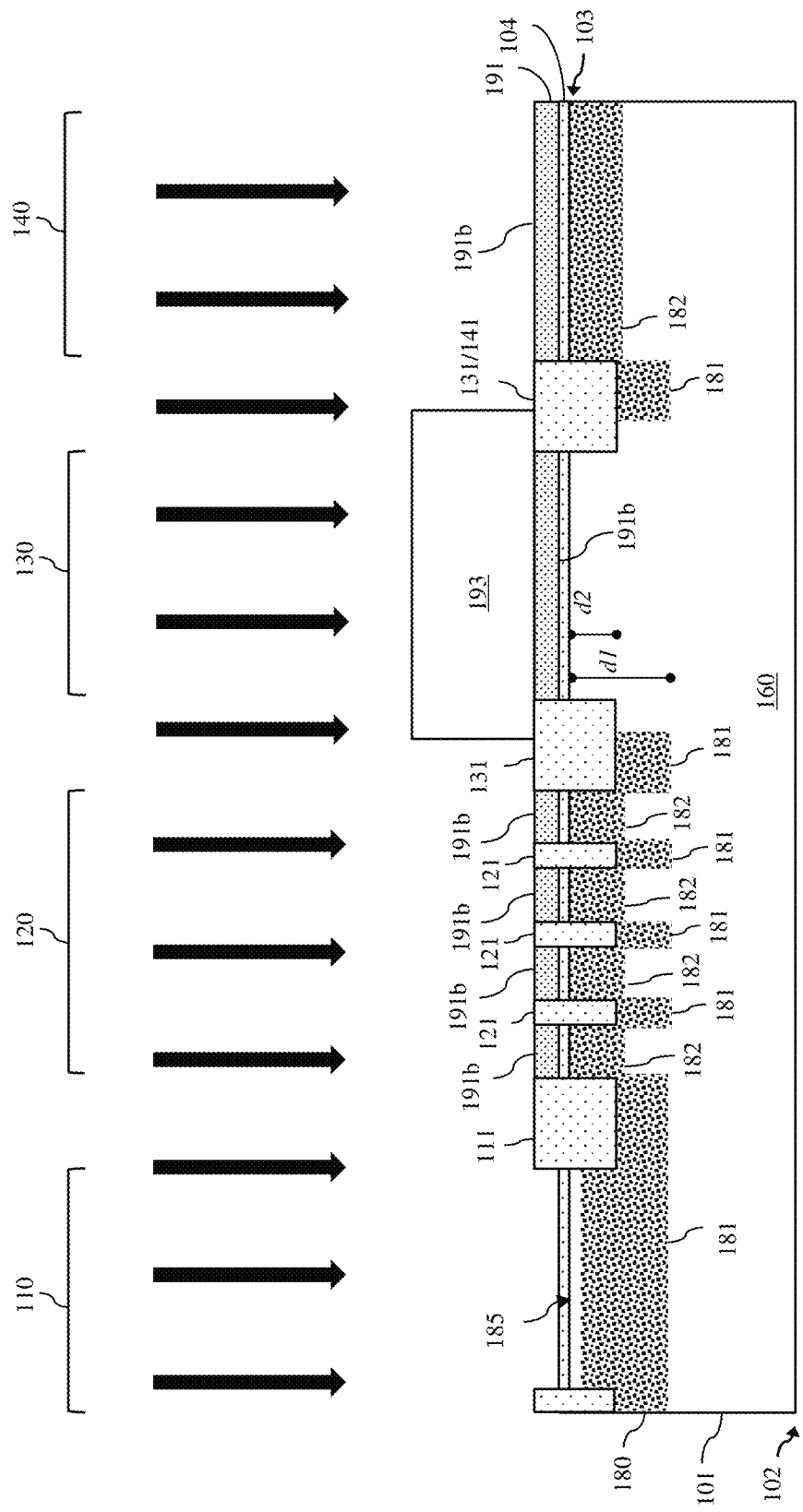

A doped region 180 with a modified crystalline structure can subsequently be formed within the semiconductor substrate 101 (see process step 222 and FIG. 10). Specifically, a dopant implantation process can be performed in order to implant an inert dopant into the semiconductor substrate 101 in order to form, within the semiconductor substrate 101, a doped region 180 that has a modified crystalline structure (e.g., an amorphous crystalline structure). For purposes of this disclosure, an inert dopant refers to a dopant species that is generally not considered to be chemically reactive (i.e., that is neutral) at least with respect to the monocrystalline semiconductor material (e.g., monocrystalline silicon) within which it is implanted at process step 222, that is capable of modifying the crystalline structure of that monocrystalline semiconductor material at process 222, that won't prevent recrystallization of the doped region 180 during the subsequent rapid thermal anneal process (RTA) at process 226, as discussed in further detail below, and that doesn't significantly impact the electrical properties of the resulting poly and/or monocrystalline semiconductor regions following recrystallization. Such inert dopants include, but are not limited to, inert gases (also referred to as noble gases) (e.g., argon, xenon, helium, neon, krypton, radon, etc.), silicon, or any other suitable inert dopant. Process step 222 can include a single dopant implantation process employed to create the doped region with the modified crystalline structure. Alternatively, process step 222 can include multiple successive dopant implantation processes and each dopant implantation process can implant dopant ions at different kinetic energies and/or different doses to optimize the modified crystalline structure within the doped region and potentially achieve greater implant depths for both the first areas 181 and the second areas 182.

In any case, during this dopant implantation process, the optional second protective layer 193, which covers the portion of the first protective layer 191 in third section 130, can prevent implantation of the inert dopant into the area of the semiconductor substrate 101 within the third section 130. That is, it completely blocks the inert dopant from entering the semiconductor substrate in this area. Due to the presences of the second protective layer 193 in the third section 130 during the dopant implantation process, the doped region 180 does not extend laterally across the third section 130. That is, the semiconductor substrate retains the crystalline structure in the third section 130.

Furthermore, during the dopant implantation process, exposed second portions 191b of the first protective layer 191 within the second section 120 and/or the fourth section 140 can locally limit the dopant implant depth in these section(s) as compared to the dopant implant depths in the first section 110 and below the STI regions (which are not masked by the first protective layer 191). That is, the second portions 191b of the first protective layer 191 can partially protect the areas of the semiconductor substrate below and, more particularly, can hinder the dopant implantation process. Thus, while the inert dopant still enters the semiconductor substrate in the protected areas, it does not reach the same depth as it does in unprotected areas. It should be noted that the inert dopant will generally reach the same depth in the unprotected areas—whether it is implanted through the thin dielectric layer 104 into the semiconductor substrate 101 or through the thicker STI regions into the semiconductor substrate 101. In any case, due to the presence of the second portions 191b of the first protective layer 191 during the dopant implantation process in the second section 120 and/or the fourth section 140, the doped region 180 will have first areas 181 and second areas 182, which are shallower in depth than the first areas 181. The first areas 181 will be positioned laterally adjacent to the first side of the first STI region 111 in the first section 110 and also below the STI regions 111, 121, 131, 141. The second areas 182 will be positioned laterally adjacent to the second side of the first STI region 111, will laterally surround the second STI regions 121 in the second section 120 and/or will be positioned laterally adjacent to the fourth STI region 141 in the fourth section 140. Finally, because the first section 110 is not protected by any portion of the first protective layer 191 during the dopant implantation process, in this section the top of the doped region 180 will be some short distance (e.g., less than 5 nm) below the top surface 103 of the semiconductor substrate 101. Thus, following process step 222, a relatively thin (e.g., less than 5 nm) crystalline layer 185 will remain within the first section 110 immediately adjacent to the bottom surface of the dielectric layer 104 (i.e., between the bottom surface of the dielectric layer 104 and the doped region 180).

The second protective layer 193 (if present) can then be selectively removed (see process step 224). As mentioned above, the second protective layer could be, for example, a photoresist mask layer or a nitride mask layer. Techniques for selectively removing such materials are well known in the art. Additionally, if the remaining portion of the mask layer 192 was not selectively removed at process step 216, it can be removed in the same manner as described above following the dopant implantation process and removal of the second protective layer 193.

The method can further include recrystallizing the doped region 180 (see process step 226 and FIG. 11). Specifically, a rapid thermal anneal (RTA) process can subsequently be performed in order to recrystallize the doped region 180, which has the modified crystalline structure. That is, the partially completed structure can be heated at a relatively high temperature (e.g., over 900° C.) for a relatively short period of time (e.g., 5-180 seconds) in a non-oxidizing ambient environment. During this recrystallization process, the thin crystalline layer 185 at the top surface 103 of the semiconductor substrate 101 in the first section 110 functions as a seed layer for recrystallization of the doped region 180 from the top downward. Additionally, in the first, second and fourth sections, the crystalline lower portion of the semiconductor substrate 101 functions as the seed layer for recrystallization of the doped region 180 from the bottom upward. As a result, a larger monocrystalline semiconductor region 112 is formed at the top surface 103 of the semiconductor substrate in the first section such that it is positioned laterally adjacent to the first side of the first STI region 111 and a multi-level polycrystalline semiconductor region 150, as described in detail above and illustrated in either FIG. 1A or 1B is also formed.

Specifically, the multi-level polycrystalline semiconductor region 150 will include one or more first-level portions 151 (i.e., one or more buried portions) and one or more second-level portions 152 (i.e., one or more non-buried portions).

Each first-level portion 151 will be within the semiconductor substrate 101, will be physically separated from the top surface 103 of the semiconductor substrate 101, and will have a first maximum depth (d1). For example, a first-level portion 151 will be in the first section 110 aligned below the monocrystalline semiconductor region 112 and the first trench isolation region 111. When the structure 100A, 100B is formed so that it includes the second section 120 (e.g., a dummy fill shape section), first-level portions 151 will also be aligned below each of the second STI regions 121. When the structure 100A, 100B is formed so that it includes the third section 130 (e.g., an additional active device section), a first-level portion 151 will also be aligned below the third STI region 131. When the structure 100A, 100B is formed so that it includes the fourth section 140 (e.g., a passive device section), a first-level portion 151 will also be aligned below the fourth STI region 141. The first maximum depth (d1) refers to the distance of the bottom (i.e., lowermost point) of a first-level portion 151 as measured from the top surface 103 of the semiconductor substrate 101. It should be noted that the first maximum depths (d1) of different first-level portions 151 are approximately the same, as illustrated; however, some across-substrate process variations may occur. For example, there may be slight differences in the maximum depth of first-level portions below the STI regions as compared to the monocrystalline semiconductor region.

Each second-level portion 152 will be immediately adjacent to the top surface 103 of the semiconductor substrate 101 and will have a second maximum depth (d2) that is less than the first maximum depth (d1). A second-level portion 152 will specifically be positioned laterally adjacent to a second side (e.g., an outer side) of the first STI region 111 opposite the first side such that the first STI region 111 is positioned laterally between the monocrystalline semiconductor region 112 and that second-level portion 152. When the structure 100A, 100B is formed so as to include, the second section 120, second-level portions 152 will be within the second section 120 laterally surrounding and extending between each of the second STI regions 121. That is, second-level portions 152 will make up the semiconductor fill shapes of the second section 120. Furthermore, when the structure 100A, 100B is formed so that it includes the fourth section. 140, a second-level portion 152 will be within the fourth section 140 and positioned laterally adjacent to the fourth STI region 141. It should be noted that the second maximum depths (d2) of different second-level portions are approximately the same; however, some across-substrate process variations may occur. In any case, the second maximum depths (d2) of all of the second-level portions 152 are less than the first maximum depths (d1) of all of the first-level portions 151.

The configuration of the multi-level polycrystalline semiconductor region 150 (e.g., as single or multi-layered) will vary depending upon the type of dopant implantation process used at process step 222. That is, as mentioned above, process step 222 can include either a single dopant implantation process or multiple successive dopant implantation processes. If a single dopant implantation process is used at process step 222, then process step 226 may result in the multi-level polycrystalline semiconductor region 150 being a single relatively thick layer of polycrystalline semiconductor material. For example, as shown in the partially completed structure of FIG. 11A, each of the first-level portions 151 and each of the second-level portions 152 is fully polycrystalline. Alternatively, if multiple successive dopant implantation processes are used at process step 222, then process step 226 may result in the multi-level polycrystalline semiconductor region 150 being multi-layered. For example, as shown in the partially completed structure of FIG. 11B, each of the first-level portions 151 and each of the second-level portions 152 include multiple defined layers of the polycrystalline semiconductor material separated by thin layers of crystalline semiconductor material.

Other characteristics will depend upon the process specification used at process step 222. For example, the thickness of the monocrystalline semiconductor region 112 can be controlled primarily by the energy of the implant (e.g., higher energy can result in a thicker monocrystalline semiconductor region 112), and secondarily by the RTA time (e.g., less RTA time can result in a thinner monocrystalline semiconductor region 112). Those skilled in the art will recognize that thickness of the monocrystalline semiconductor region 112 (as measured from the top surface of the semiconductor substrate to the top of the first-level portion 151 of the polycrystalline semiconductor region 150 below) should be sufficient to allow a semiconductor device 113 to be formed thereon (see process step 232 below) and to function properly.

In any case, the multi-level polycrystalline semiconductor region 150 will not extend down to the bottom surface 102 of the semiconductor substrate 101. Thus, the resulting semiconductor structure 100A, 100B will also include an additional monocrystalline semiconductor region 160. In the first section 110 (e.g., the active semiconductor device section) and, if present, in the second section 120 (e.g., the dummy fill shape section) and/or in the fourth section 140 (e.g., the passive device section), the additional monocrystalline semiconductor region 160 will encompass the lower portion of the semiconductor substrate, extending from the bottom of the multi-level polycrystalline semiconductor region 150 (and, particularly, from the bottoms of the different levels 151-152 of the multi-level polycrystalline semiconductor region 150) to the bottom surface 102 of the semiconductor substrate 101. In the third section 130 (e.g., the additional active semiconductor device section), if present, this additional monocrystalline semiconductor region 160 will extend from the top surface 103 of the semiconductor substrate 101 to the bottom surface 102 of the semiconductor substrate 101.

It should be noted that a processing artifact and, particularly, a relatively thin region 153 of high-resistivity polycrystalline semiconductor material (e.g., a relatively thin region of high-resistivity polysilicon) may also appear in the semiconductor substrate aligned below the multi-level polycrystalline semiconductor region 150 following the RTA at process step. This relatively thin region 153 may vary in shape. For example, it could have multi-level portions (similar to the profile shown or with some other profile) or, alternatively, it could be essentially planar.

Figure 12:
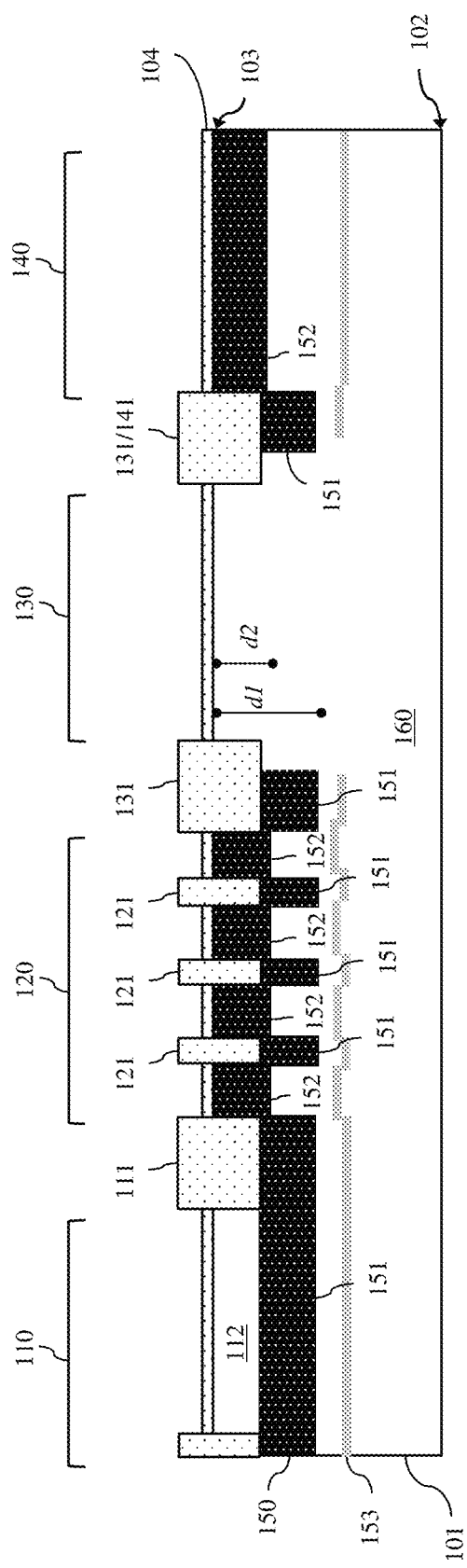

Following recrystallization of the doped region 180, the remaining second portions 191b of the first protective layer 191 can be selectively removed (see process step 228 and FIG. 12). For example, as discussed above with regard to the selective removal of the first portion 191a of the first protective layer at process step 214, if the dielectric layer 104 and the STI regions are made of the same first dielectric material (e.g., $SiO_2$) and if the first protective layer 191 is made of the second dielectric material (e.g., SiN), then any suitable process that selectively etches exposed SiN over exposed $SiO_2$ could be employed. Thus, a hot phosphoric acid etch process could be used.

Figure 13:
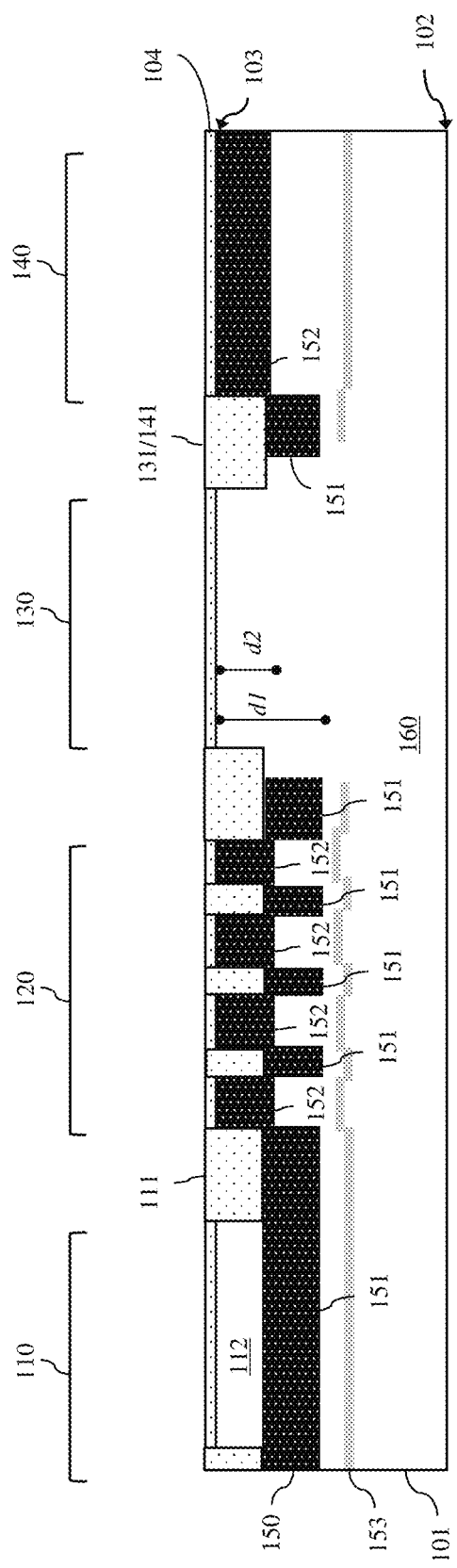

Optionally, the height of the STI regions could be reduced (e.g., using a wet etch process) (see process step 230 and FIG. 13). It should be noted that, if process step 230 results in removal of the dielectric layer 104 and exposure of the semiconductor surface below, the first dielectric material can be redeposited (e.g., by thermal oxidation) to reform this layer 104.

Figure 11A:
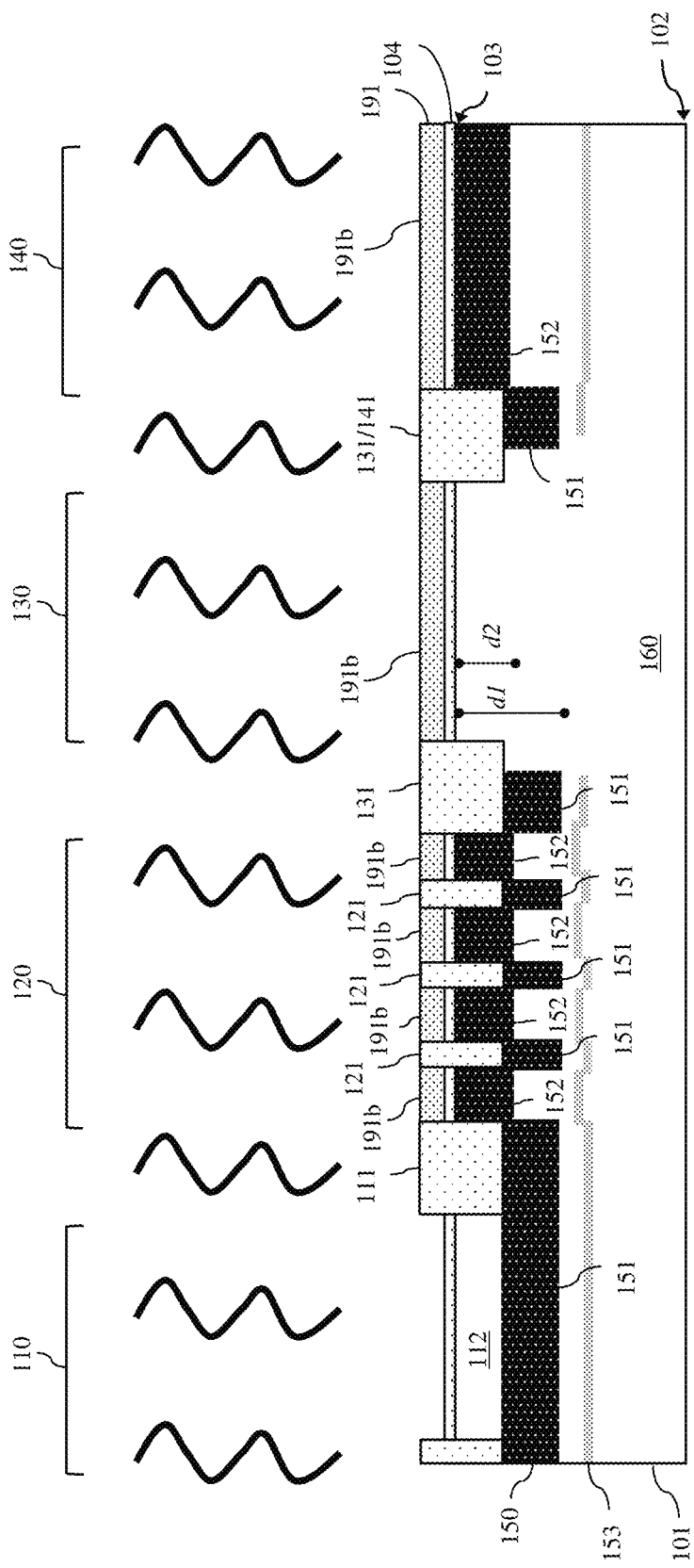
Figure 11B:
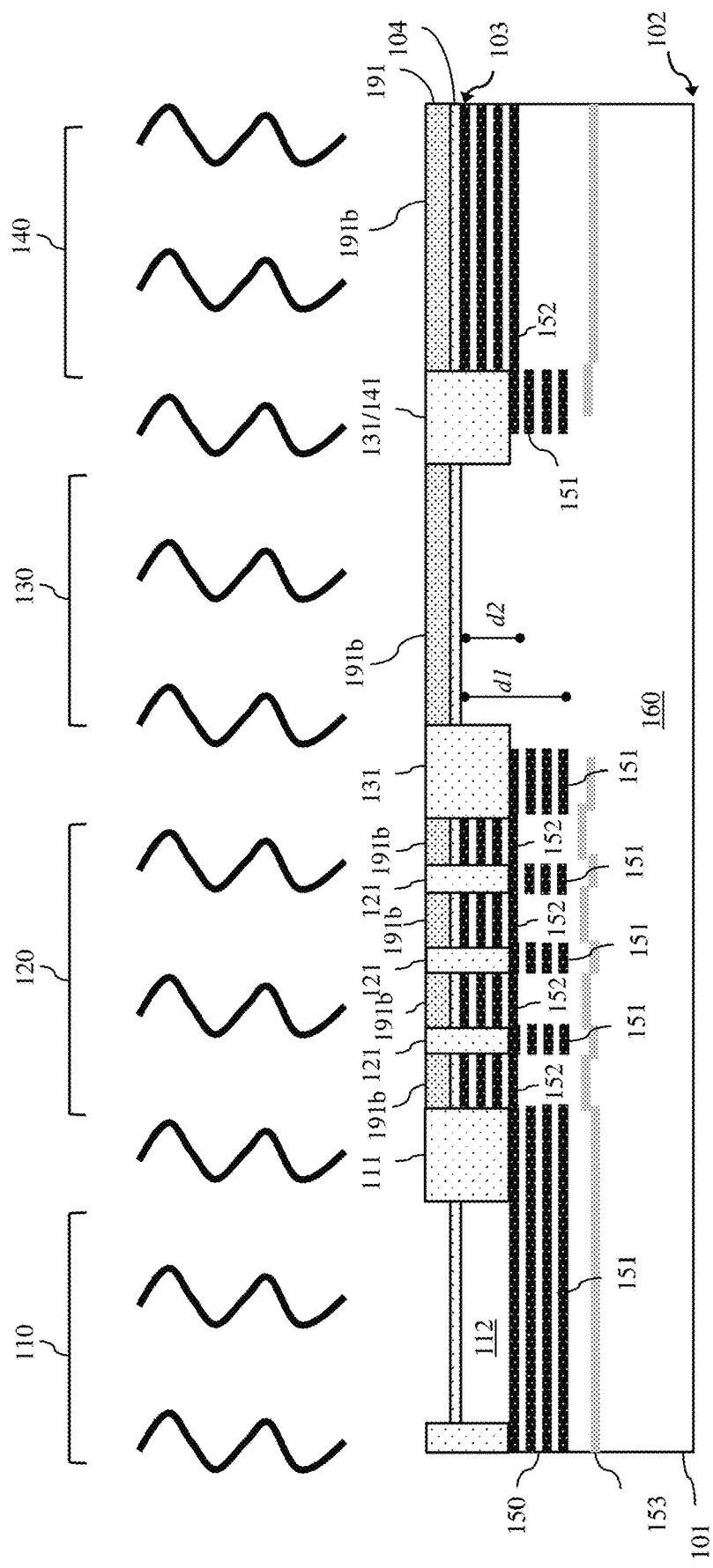

It should be understood that, although process steps 228 and 230 are illustrated in FIGS. 12-13 as being performed with respect to the partially completed structure shown in FIG. 11A, the same process steps would also be performed with respect to the partially completed structure shown in FIG. 11B.

Additional processing can subsequently be performed in order to complete the semiconductor structure 100A, 100B (see process step 232 and FIGS. 1A and 1B). The additional processing can include semiconductor device formation. For example, one or more semiconductor devices 113 can be formed in the first section 110 and one or more additional semiconductor devices 133 can concurrently be formed in the third section 130 (if present). The semiconductor device(s) 113 can include radio frequency (RF) device(s), such as an RF switch, and/or any other type of semiconductor device (e.g., a bipolar junction transistor, etc.) that would benefit from being isolated from the additional monocrystalline semiconductor region 160 by a first-level portion 151 (i.e., a buried portion) of a high-resistivity multi-level polycrystalline semiconductor region 150. The additional semiconductor device(s) 133 can be complementary metal oxide semiconductor (CMOS) device(s), bipolar junction transistor(s), etc., that by design may not require or significantly benefit from such buried isolation. The additional processing can further include middle-of-the-line (MOL) processing (e.g., interlayer dielectric deposition, contact formation, etc.) and back-end-of-the-line (BEOL) processing (e.g., metal level formation). Optionally, the additional processing performed can also include the formation of at least one passive device 143 (e.g., a resistor, a capacitor, an inductor, etc.) above the top surface 103 of the semiconductor substrate 101 (e.g., at the gate polysilicon layer (as shown) or, alternatively, in the back-end-of-the-line (BEOL) metal levels (not shown)). Such a passive device 143 may also benefit from the additional isolation provided by the in-substrate high-resistivity multi-level polycrystalline semiconductor region 150 and, particularly, may exhibit reduced parasitic loss due to this region 150. Techniques for forming semiconductor devices and passive devices for semiconductor structures are well known in the art. Thus, the details of those techniques have been omitted from this specification in order to allow the reader to focus on the salient aspects of the disclosed methods.

It should be understood that in the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a semiconductor substrate; and
trench isolation regions in the semiconductor substrate, wherein the semiconductor substrate comprises:
a monocrystalline semiconductor region at a top surface of the semiconductor substrate positioned laterally adjacent to a first side of a first trench isolation region; and
a multi-level polycrystalline semiconductor region comprising:
a first-level portion below the monocrystalline semiconductor region; and
a second-level portion at the top surface of the semiconductor substrate positioned laterally adjacent to a second side of the first trench isolation region opposite the first side, wherein the first-level portion has a first maximum depth and the second-level portion has a second maximum depth that is less than the first maximum depth.

2. The semiconductor structure of claim 1, wherein the multi-level polycrystalline semiconductor region contains an inert dopant.

3. The semiconductor structure of claim 1, further comprising a semiconductor device on the monocrystalline semiconductor region.

4. The semiconductor structure of claim 1, further comprising a radio frequency switch on the monocrystalline semiconductor region.

5. The semiconductor structure of claim 1, further comprising a first section and a second section,
wherein the monocrystalline semiconductor region is in the first section,
wherein the first trench isolation region is positioned laterally between the first section and the second section,
wherein the trench isolation regions comprise: the first trench isolation region; and second trench isolation regions in the semiconductor substrate within the second section, wherein the multi-level polycrystalline semiconductor region comprises multiple first-level portions and multiple second-level portions, wherein the first-level portions are physically separated from the top surface of the semiconductor substrate and at least below the monocrystalline semiconductor region, the first trench isolation region and each of the second trench isolation regions, and wherein the second-level portions are at the top surface of the semiconductor substrate at least positioned laterally adjacent to the second side of the first trench isolation region and extending between the second trench isolation regions.

6. The semiconductor structure of claim 5, wherein the semiconductor substrate further comprises an additional monocrystalline semiconductor region extending from the multi-level polycrystalline semiconductor region to a bottom surface of the semiconductor substrate in the first section and in the second section.

7. The semiconductor structure of claim 6, further comprising a third section, wherein the trench isolation regions further comprise a third trench isolation region in the semiconductor substrate adjacent to the third section, wherein one of the first-level portions of the multi-level polycrystalline semiconductor region is below the third trench isolation region, and wherein the additional monocrystalline semiconductor region extends from the top surface of the semiconductor substrate to the bottom surface of the semiconductor substrate in the third section.

8. The semiconductor structure of claim 6, further comprising a fourth section, wherein the trench isolation regions further comprise a fourth trench isolation region in the semiconductor substrate adjacent to the fourth section, wherein one of the first-level portions of the multi-level polycrystalline semiconductor region is below the fourth trench isolation region and one of the second-level portions of the multi-level polycrystalline semiconductor region is in the fourth section at the top surface of the semiconductor substrate positioned laterally adjacent to the fourth trench isolation region, and wherein the additional monocrystalline semiconductor region extends from the multi-level polycrystalline semiconductor region to the bottom surface of the semiconductor substrate in the fourth section.

9. A method comprising:

forming trench isolation regions in a semiconductor substrate; and forming a multi-level polycrystalline semiconductor region in the semiconductor substrate such that the multi-level polycrystalline semiconductor region comprises:

a first-level portion below a monocrystalline semiconductor region, wherein the monocrystalline semiconductor region is at a top surface of the semiconductor substrate positioned laterally adjacent to a first side of a first trench isolation region and wherein the first-level portion has a first maximum depth; and a second-level portion at the top surface of the semiconductor substrate positioned laterally adjacent to a second side of the first trench isolation region opposite the first side, wherein the second-level portion has a second maximum depth that is less than the first maximum depth.

10. The method of claim 9, wherein the forming of the multi-level polycrystalline semiconductor region comprises:

forming, within the semiconductor substrate, a doped region such that the doped region has a modified crystalline structure, wherein, during the forming of the doped region, the semiconductor substrate on the second side of the first trench isolation region is locally protected to limit a depth in the doped region; and recrystallizing the doped region, wherein the recrystallizing of the doped region creates the monocrystalline semiconductor region and the multi-level polycrystalline semiconductor region.

11. The method of claim 9, further comprising forming a semiconductor device on the monocrystalline semiconductor region.

12. The method of claim 9, wherein the forming of the trench isolation regions further comprises forming the first trench isolation region in the semiconductor substrate between a first section and a second section of a semiconductor structure; and forming second trench isolation regions in the semiconductor substrate in the second section, and wherein the multi-level polycrystalline semiconductor region is formed so as to comprise:

multiple first-level portions that are physically separated from the top surface of the semiconductor substrate and at least below the monocrystalline semiconductor region, the first trench isolation region, and each of the second trench isolation regions; and multiple second-level portions that are at the top surface of the semiconductor substrate at least positioned laterally adjacent to the second side of the first trench isolation region and extending laterally between the second trench isolation regions.

13. The method of claim 12, wherein, following formation of the multi-level polycrystalline semiconductor region, an additional monocrystalline semiconductor region extends from the multi-level polycrystalline semiconductor region to a bottom surface of the semiconductor substrate is in the first section and in the second section.

14. The method of claim 13, wherein the forming of the trench isolation regions further comprises forming a third trench isolation region in the semiconductor substrate adjacent to a third section of the semiconductor structure, and wherein the multi-level polycrystalline semiconductor region is formed so that one of the first-level portions is below the third trench isolation region and so that the additional monocrystalline semiconductor region extends from the top surface of the semiconductor substrate to the bottom surface of the semiconductor substrate in the third section.

15. The method of claim 13, wherein the forming of the trench isolation regions comprises forming a fourth trench isolation region in the semiconductor substrate adjacent to a fourth section of the semiconductor structure, and wherein the multi-level polycrystalline semiconductor region is formed so that one of the first-level portions is below the fourth trench isolation region, so that one of the second-level portions is in the fourth section at the top surface of the semiconductor substrate positioned laterally adjacent to the fourth trench isolation region, and so that the additional monocrystalline semiconductor region extends from the multi-level polycrystalline semiconductor region to the bottom surface of the semiconductor substrate in the fourth section.

16. A method comprising:

forming a protective layer on a semiconductor substrate;

forming trench isolation regions that extend through the protective layer into the semiconductor substrate; and forming a multi-level polycrystalline semiconductor region in the semiconductor substrate, wherein the forming of the multi-level polycrystalline semiconductor region comprises:

forming an opening in the protective layer above the semiconductor substrate on a first side of a first trench isolation region such that the protective layer remains intact above the semiconductor substrate on a second side of the first trench isolation region opposite the first side;

forming, within the semiconductor substrate, a doped region such that the doped region has a modified crystalline structure, wherein, during the forming of the doped region, a remaining portion of the protective layer locally limits a depth of the doped region; and recrystallizing the doped region, wherein the recrystallizing of the doped region creates a monocrystalline semiconductor region at a top surface of the semiconductor substrate positioned laterally adjacent to the first side of the first trench isolation region and the multi-level polycrystalline semiconductor region comprising:

a first-level portion below the monocrystalline semiconductor region; and a second-level portion at the top surface of the semiconductor substrate positioned laterally adjacent to the second side of the first trench isolation region, wherein the first-level portion has a first maximum depth and the second-level portion has a second maximum depth that is less than the first maximum depth.

17. The method of claim 16, further comprising forming a semiconductor device on the monocrystalline semiconductor region.

18. The method of claim 16, wherein the forming of the trench isolation regions comprises: forming the first trench isolation region in the semiconductor substrate between a first section and a second section of a semiconductor structure; and forming multiple second trench isolation regions in the semiconductor substrate in the second section such that the protective layer extends laterally between the second trench isolation regions and is further positioned laterally adjacent to the second side of the first trench isolation region, wherein the forming of the doped region and the recrystallizing of the doped region are performed such that the multi-level polycrystalline semiconductor region comprises multiple first-level portions and multiple second-level portions, wherein the first-level portions are physically separated from the top surface of the semiconductor substrate and are at least below the monocrystalline semiconductor region, the first trench isolation region and each of the second trench isolation regions, and wherein the second-level portions are at the top surface of the semiconductor substrate and are at least positioned laterally adjacent to the second side of the first trench isolation region and extending laterally between the second trench isolation regions.

19. The method of claim 18, wherein, following formation of the multi-level polycrystalline semiconductor region, an additional monocrystalline semiconductor region extends from the multi-level polycrystalline semiconductor region to a bottom surface of the semiconductor substrate in the first section and the second section.

20. The method of claim 19, wherein the forming of the trench isolation regions further comprises forming a third trench isolation region in the semiconductor substrate adjacent to a third section of the semiconductor structure, wherein the multi-level polycrystalline semiconductor region is further formed so that one of the first-level portions is below the third trench isolation region and so that the additional monocrystalline semiconductor region extends from the top surface of the semiconductor substrate to the bottom surface of the semiconductor substrate in the third section.

* * * * *